(12) United States Patent
Huang

(10) Patent No.: US 7,990,303 B2
(45) Date of Patent: Aug. 2, 2011

(54) ANALOG-TO-DIGITAL CONVERSION UNIT AND ANALOG-TO-DIGITAL CONVERTING METHOD THEREOF

(75) Inventor: Chih-Haur Huang, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 0 days.

(21) Appl. No.: 12/639,008

(22) Filed: Dec. 16, 2009

(65) Prior Publication Data

US 2011/0140947 A1    Jun. 16, 2011

(51) Int. Cl.
*H03M 1/34* (2006.01)
*H03M 1/38* (2006.01)
(52) U.S. Cl. .................. 341/162; 341/155; 341/161
(58) Field of Classification Search .............. 341/155, 341/156, 161, 162
See application file for complete search history.

(56) References Cited

U.S. PATENT DOCUMENTS

2009/0021412 A1\* 1/2009 Gustafsson .................. 341/155
\* cited by examiner

*Primary Examiner* — Jean B Jeanglaude
(74) *Attorney, Agent, or Firm* — Jianq Chyun IP Office

(57) ABSTRACT

An analog-to-digital conversion unit (ADC unit) and an analog-to-digital converting method (ADC method) are provided. The ADC unit has a plurality of sub analog-to-digital converters and an encoding unit. Each of the employed sub analog-to-digital converters is coupled to two threshold voltages non-successive in terms of levels arrangement, compares the input voltage with the two threshold voltages and outputs two bits according to the comparison results. In this way, the difference between the two threshold voltages coupled by each of the sub analog-to-digital converters can be larger, which is advantageous in advancing the analog-to-digital converting accuracy.

12 Claims, 2 Drawing Sheets

ANALOG-TO-DIGITAL CONVERSION UNIT AND ANALOG-TO-DIGITAL CONVERTING METHOD THEREOF

BACKGROUND OF THE INVENTION

1. Field of the Invention

The present invention generally relates to an analog-to-digital conversion unit (ADC unit), and more particularly, to an ADC unit and an analog-to-digital converting method (ADC method) thereof able to increase the conversion accuracy.

2. Description of Related Art

In the modern time, the computer has become indispensable means for the modern people. Since a digital data is easier for editing, analyzing, storing and more robust against noise, the most of information currently are in digital format so as to facilitate storing and processing. In order to convert analog information (such as temperature, humidity, luminance, sound) into a digital data, an analog-to-digital converter is used for converting the format of the analog information. Besides, along with the progress of since and technology, the sampling precision of an analog-to-digital converter on analog information is advanced, so that the conformability between the digital data obtained through high-precision converting and the corresponding environment information is higher, wherein the adopted high-precision analog-to-digital converter is, for example, a pipelined analog-to-digital converter.

FIG. 1 is a block diagram of a pipelined stage in a conventional pipelined analog-to-digital converter and FIG. 2 is a conversion characteristic curve graph of a pipelined analog-to-digital converter. Referring to FIGS. 1 and 2, in a pipelined stage 100 of a pipelined analog-to-digital converter, the pipelined stage 100 includes an ADC unit 110. The ADC unit 110 is coupled to a digital-to-analog converter 120 and produces a digital data DOUT according to an input voltage VIN. The digital-to-analog converter 120 converts the digital data DOUT into an analog output voltage VOUT.

A sub analog-to-digital converter 111 herein compares the input voltage VIN respectively with two threshold voltages VTH1 and VTH2 and then outputs two bits B1 and B2 according to the comparison result. Another sub analog-to-digital converter 112 herein compares the input voltage VIN respectively with another two threshold voltages VTH3 and VTH4 and then outputs two bits B3 and B4 according to the comparison result. Further, yet another sub analog-to-digital converter 113 herein compares the input voltage VIN respectively with yet another two threshold voltages VTH5 and VTH6 and then outputs two bits B5 and B6 according to the comparison result. An encoding unit 314 encodes the bits B1, B2, B3, B4, B5 and B6 and then outputs the digital data DOUT.

The sub analog-to-digital converter usually employs a comparator for comparing voltages, wherein the offset error of the comparator would affect the voltage level of the threshold voltage. Taking the sub analog-to-digital converter 111 as an example, the offset error of the comparator may make the voltage level of the threshold voltage VTH1 shift towards the threshold voltage VTH2. In the above-mentioned circumstance, if the sub analog-to-digital converter 111 compares the input voltage with a shifted threshold voltage, the output bits B1 and B2 may be incorrect ones, and moreover, the ADC unit 110 would output incorrect digital data.

SUMMARY OF THE INVENTION

Accordingly, the present invention is directed to an ADC unit and an ADC method thereof so as to advance the analog-to-digital converting accuracy.

The present invention provides an ADC unit configured for a pipelined analog-to-digital converter. The ADC unit includes a plurality of sub analog-to-digital converters and an encoding unit. Each of the sub analog-to-digital converters is respectively and correspondingly coupled to one of a plurality of first threshold voltages, one of a plurality of second threshold voltages and an input voltage. Each of the sub analog-to-digital converters respectively compares the input voltage with the received first threshold voltage and second threshold voltage and outputs a first bit and a second bit according to the comparison results, wherein the first threshold voltage and the second threshold voltage received by each of the sub analog-to-digital converters are two threshold voltages non-successive in terms of levels arrangement of all the first threshold voltages and second threshold voltages, and the encoding unit is coupled to the sub analog-to-digital converters, encodes all the first bits and second bits and outputs a digital data.

The present invention also provides an ADC method suitable for a pipelined analog-to-digital converter. The method includes following steps: receiving a plurality of first threshold voltages, a plurality of second threshold voltages and an input voltage; respectively comparing the input voltage with the first threshold voltages and the second threshold voltages, and outputting a plurality of first bits and a plurality of second bits according to the comparison results thereof; encoding the said first bits and second bits so as to output a digital data, wherein the first threshold voltage and the second threshold voltage respectively corresponding to each of the first bits and each of the second bits during the above-mentioned comparisons are two threshold voltages non-successive in terms of levels arrangement of all the threshold voltages.

In an embodiment of the present invention, the above-mentioned first threshold voltage is less than the second threshold voltage.

The present invention further provides an ADC unit, which is configured for a pipelined analog-to-digital converter and includes a first sub analog-to-digital converter, a second sub analog-to-digital converter, a third sub analog-to-digital converter and an encoding unit. The first sub analog-to-digital converter is coupled to an input voltage, a first threshold voltage and a second threshold voltage, wherein the first sub analog-to-digital converter compares the input voltage with the first threshold voltage and the second threshold voltage, and the first sub analog-to-digital converter outputs a first bit and a second bit according to the comparison result. The second sub analog-to-digital converter is coupled to the above-mentioned input voltage, a third threshold voltage and a fourth threshold voltage, wherein the second sub analog-to-digital converter compares the input voltage with the third threshold voltage and the fourth threshold voltage and outputs a third bit and a fourth bit according to the comparison result. The third sub analog-to-digital converter is coupled to the above-mentioned input voltage, a fifth threshold voltage and a sixth threshold voltage, wherein the third sub analog-to-digital converter compares the input voltage with the fifth threshold voltage and the sixth threshold voltage and outputs a fifth bit and a sixth bit according to the comparison result. The encoding unit is coupled to the first sub analog-to-digital converter, the second sub analog-to-digital converter and the third sub analog-to-digital converter for encoding the first bit, the second bit, the third bit, the fourth bit, the fifth bit and the sixth bit and outputting a digital data, wherein the first threshold voltage and the second threshold voltage, the third threshold voltage and the fourth threshold voltage and the fifth threshold voltage and the sixth threshold voltage are respectively two threshold voltages non-successive in terms of levels arrangement of all the threshold voltages.

The present invention further provides an ADC method, which is suitable for a pipelined analog-to-digital converter and includes following steps: receiving a first threshold voltage, a second threshold voltage, a third threshold voltage, a fourth threshold voltage, a fifth threshold voltage, a sixth threshold voltage and an input voltage; respectively comparing the input voltage with the first threshold voltage, the second threshold voltage, the third threshold voltage, the fourth threshold voltage, the fifth threshold voltage and the sixth threshold voltage; outputting a first bit and a second bit according to the comparison results between the input voltage and the first threshold voltage and between the input voltage and the second threshold voltage; outputting a third bit and a fourth bit according to the comparison results between the input voltage and the third threshold voltage and between the input voltage and the fourth threshold voltage; outputting a fifth bit and a sixth bit according to the comparison results between the input voltage and the fifth threshold voltage and between the input voltage and the sixth threshold voltage; encoding the first bit, the second bit, the third bit, the fourth bit, the fifth bit and the sixth bit so as to output a digital data, wherein the first threshold voltage and the second threshold voltage are two non-successive threshold voltages, the third threshold voltage and the fourth threshold voltage are two non-successive threshold voltages and the fifth threshold voltage and the sixth threshold voltage are two non-successive threshold voltages in terms of levels arrangement of all the threshold voltages.

In an embodiment of the present invention, the above-mentioned first threshold voltage, second threshold voltage, third threshold voltage, fourth threshold voltage, fifth threshold voltage and sixth threshold voltage are sequentially arranged as the sixth threshold voltage, the fourth threshold voltage, the second threshold voltage, the fifth threshold voltage, the third threshold voltage and the first threshold voltage from high level to low level according to the levels of all the threshold voltages.

In an embodiment of the present invention, the length of the above-mentioned digital data is three bits.

In an embodiment of the present invention, each of the above-mentioned sub analog-to-digital converters is a 1.5-bit analog-to-digital converter.

Based on the description of the ADC unit and the ADC method provided by the present invention, each of the sub analog-to-digital converters is coupled to threshold voltages non-successive in terms of levels arrangement and determines outputs according to the comparison results between the input voltage and the coupled threshold voltages. In this way, the difference between the two threshold voltages coupled by each of the sub analog-to-digital converters can be larger, which is advantageous in avoiding any threshold voltage with an offset error from causing a wrong comparison result, thereby avoiding to output wrong bits and advancing the analog-to-digital converting accuracy.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
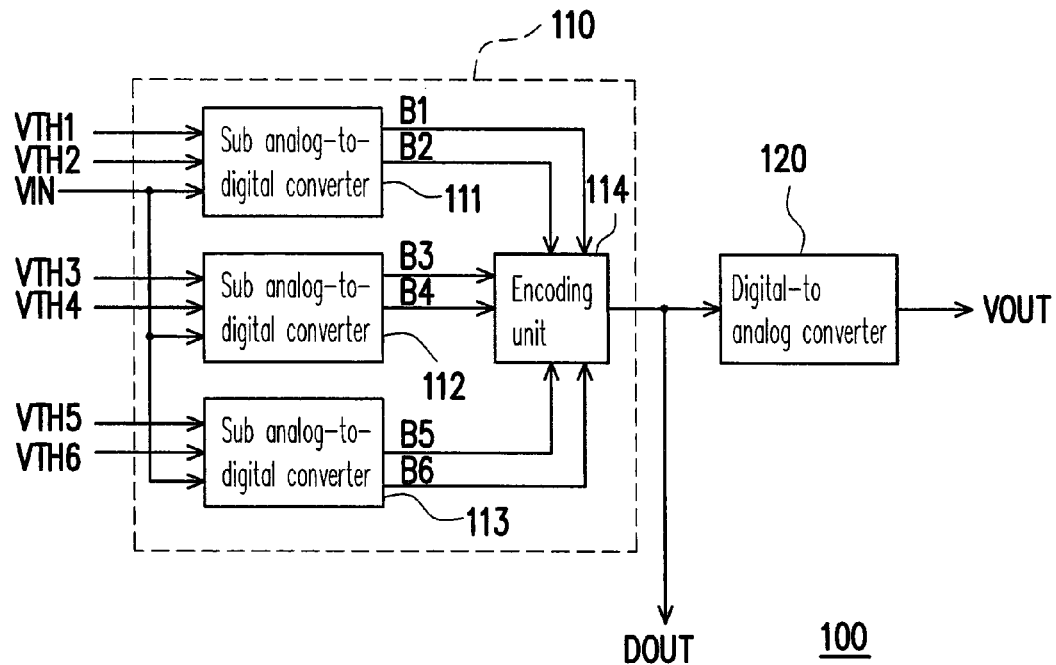
FIG. 1 is a block diagram of a pipelined stage in a conventional pipelined analog-to-digital converter.

Reference will now be made in detail to the present preferred embodiments of the invention, examples of which are illustrated in the accompanying drawings. Wherever possible, the same reference numbers are used in the drawings and the description to refer to the same or like parts.

Figure 3:
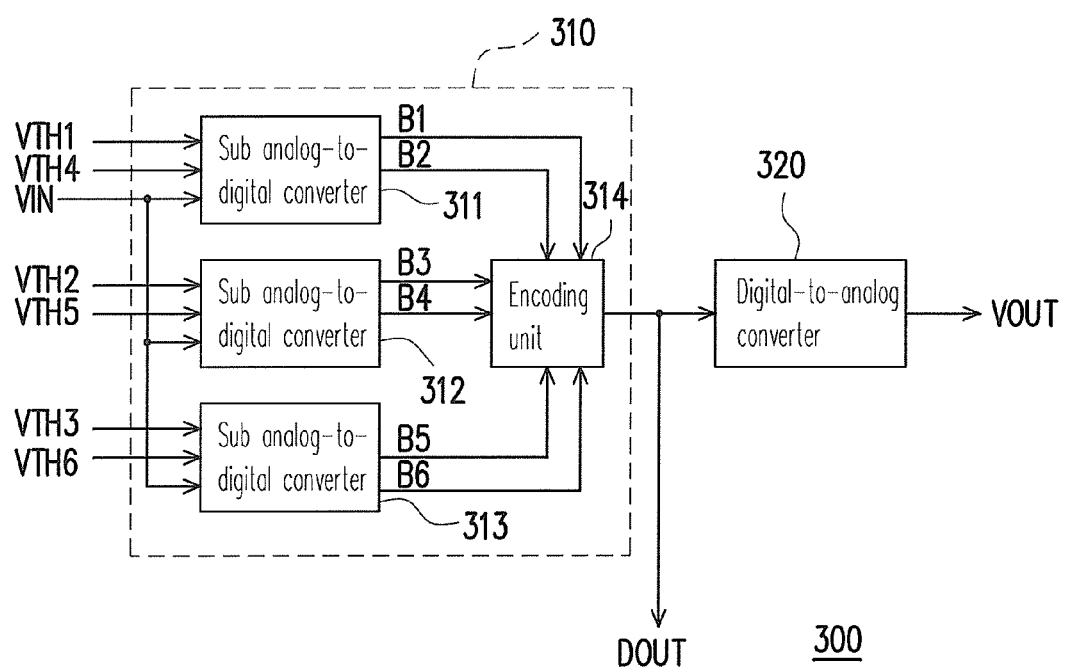
FIG. 3 is a block diagram showing the functions of an analog-to-digital converting circuit according to an embodiment of the present invention.

FIG. 3 is a block diagram showing the functions of an analog-to-digital converting circuit according to an embodiment of the present invention. Referring to FIG. 3, a converting circuit 300 includes an ADC unit 310 and the ADC unit 310 is coupled to a digital-to-analog converter 320, wherein the converting circuit 300 can be a pipelined stage of a pipelined analog-to-digital converter. The ADC unit 310 produces a digital data DOUT according to an input voltage VIN, and the digital-to-analog converter 320 converts the digital data DOUT into an analog output voltage VOUT. The output voltage VOUT is provided to the next stage and serves as the base for the next stage for analog-to-digital converting.

The ADC unit 310 includes three sub analog-to-digital converters 311, 312 and 313 and an encoding unit 314, wherein the sub analog-to-digital converters 311, 312 and 313 can respectively be a 1.5-bit analog-to-digital conversion unit, and the ADC unit 310 can be a 2.5-bit analog-to-digital converter. The sub analog-to-digital converter 311 is coupled to the input voltage VIN, a threshold voltage VTH1 and a threshold voltage VTH4. The sub analog-to-digital converter 311 compares the input voltage VIN respectively with the threshold voltages VTH1 and VTH4 and outputs bits B1 and B2 according to the comparison results.

The sub analog-to-digital converter 312 is coupled to the input voltage VIN, a threshold voltage VTH2 and a threshold voltage VTH5. The sub analog-to-digital converter 312 compares the input voltage VIN respectively with the threshold voltages VTH2 and VTH5 and outputs bits B3 and B4 according to the comparison results. The sub analog-to-digital converter 313 is coupled to the input voltage VIN, a threshold voltage VTH3 and a threshold voltage VTH6. The sub analog-to-digital converter 313 compares the input voltage VIN respectively with the threshold voltages VTH3 and VTH6 and outputs bits B5 and B6 according to the comparison results.

Figure 2:
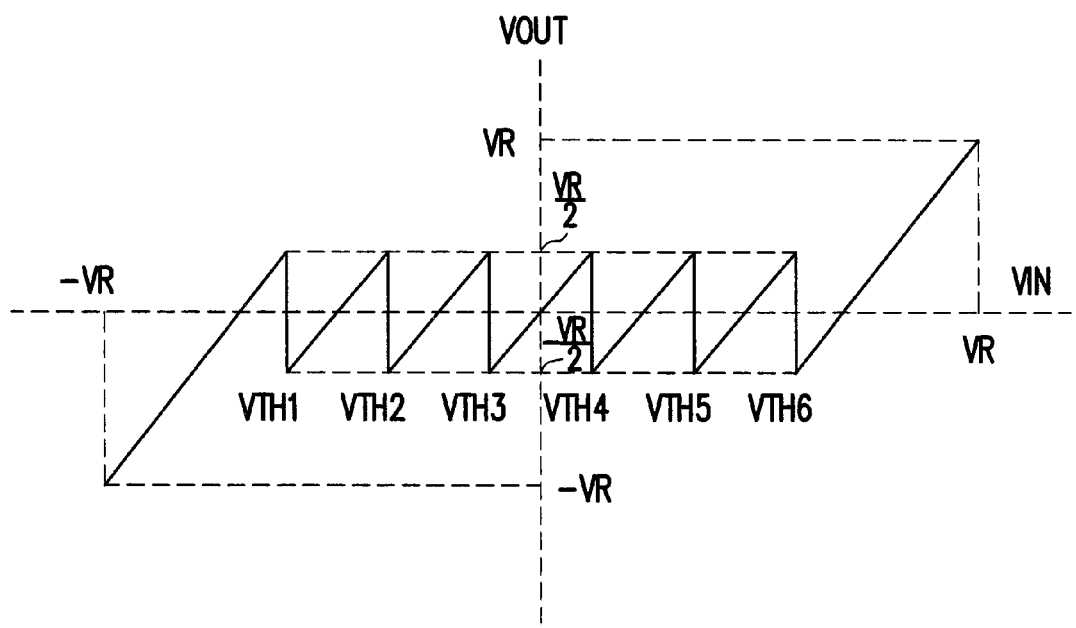
FIG. 2 is a conversion characteristic curve graph of a pipelined analog-to-digital converter.

Referring to FIG. 2, in terms of the levels of the threshold voltages, the above-mentioned threshold voltages VTH1, VTH2, VTH3, VTH4, VTH5 and VTH6 are subject to the following relationship: VTH6>VTH5>VTH4>VTH3>VTH2>VTH1. It can be seen that the threshold voltages VTH1 and VTH4 are separated by the threshold voltages VTH2 and VTH3, the threshold voltages VTH2 and VTH5 are separated by the threshold voltages VTH3 and VTH4, and the threshold voltages VTH3 and VTH6 are separated by the threshold voltages VTH4 and VTH5. In other words, the threshold voltage VTH4 is much greater than the threshold voltage VTH1, the threshold voltage VTH5 is much greater than the threshold voltage VTH2 and the threshold voltage VTH6 is much greater than the threshold voltage VTH3. In this way, the two threshold voltages respectively received by each of the sub analog-to-digital converters 311, 312 and 313 are spaced from each other, which is advantageous in avoiding any threshold voltage with an offset error from outputting wrong bits and advancing the analog-to-digital converting accuracy.

The encoding unit 314 is coupled to the sub analog-to-digital converters 311, 312 and 313 for encoding the bits B1, B2, B3, B4, B5 and B6 and then outputting the encoding results serving as the digital data DOUT, wherein the length of the digital data DOUT is three bits. In addition, when the level of the input voltage VIN is between the levels of the threshold voltages VTH1 and VTH6, the output voltage VOUT of the digital-to-analog converter 320 is between VR/2 and −VR/2, wherein VR is the level range of the input voltage VIN.

It should be noted that in the embodiment, each sub analog-to-digital converter can use two comparators for comparing the input voltage VIN with two threshold voltages. For example, the sub analog-to-digital converter 311 can use a comparator for comparing the input voltage VIN with the threshold voltage VTH1, and use another comparator for comparing the input voltage VIN with the threshold voltage VTH4, so that the 1.5-bit analog-to-digital converter 311 can have two comparators, and analogically for the rest sub analog-to-digital converters 312 and 313. On the other hand, the 2.5-bit ADC unit 310 has three 1.5-bit sub analog-to-digital converters, so that the 2.5-bit ADC unit 310 can have six comparators. It can be easily deduced that in a pipelined analog-to-digital converter, the number of the employed comparators is $s^N-2$, wherein N is a round number of the number of bits of an analog-to-digital converter.

Based on the depiction of the above-mentioned embodiment, an ADC method can be deduced and applicable to the ADC unit 310. The ADC method includes following steps. First, an input voltage VIN and six threshold voltages VTH1, VTH2, VTH3, VTH4, VTH5 and VTH6 are received. Next, the input voltage VIN is respectively compared with the threshold voltages VTH1, VTH2, VTH3, VTH4, VTH5 and VTH6 and outputs bits B1, B2, B3, B4, B5 and B6 according to the comparison results. Then, the bits B1 and B2 are used to determine the comparison results between the input voltage VIN and the threshold voltages VTH1 and VTH4, the bits B3 and B4 are used to determine the comparison results between the input voltage VIN and the threshold voltages VTH2 and VTH5 and the bits B5 and B6 are used to determine the comparison results between the input voltage VIN and the threshold voltages VTH3 and VTH6. Finally, the bits B1, B2, B3, B4, B5 and B6 are encoded and the encoding results serving as a digital data DOUT are output.

In summary, the ADC unit and the ADC method provided by the present invention feature that each of the employed sub analog-to-digital converters is coupled to threshold voltages non-successive in terms of levels arrangement, compares the input voltage with the coupled threshold voltages and outputs bits according to the comparison results. In this way, the difference between the two threshold voltages coupled by each of the sub analog-to-digital converters can be larger, which is advantageous in avoiding any threshold voltage with an offset error from causing a wrong comparison result, thereby avoiding to output wrong bits and advancing the analog-to-digital converting accuracy.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An analog-to-digital conversion unit, configured for a pipelined analog-to-digital converter and comprising:

a plurality of sub analog-to-digital converters, wherein the sub analog-to-digital converters are respectively and correspondingly coupled to a plurality of first threshold voltages, a plurality of second threshold voltages and an input voltage, the sub analog-to-digital converters respectively compare the input voltage with the first threshold voltages and the second threshold voltages and output a plurality of first bits and a plurality of second bits according to the comparison results, wherein the first threshold voltage and the second threshold voltage received by each of the sub analog-to-digital converters are two threshold voltages non-successive in terms of levels arrangement of all the first threshold voltages and second threshold voltages; and an encoding unit, coupled to the sub analog-to-digital converters for encoding the first bits and the second bits and outputting a digital data.

2. The analog-to-digital conversion unit as claimed in claim 1, wherein each of the sub analog-to-digital converters is a 1.5-bit analog-to-digital converter.

3. The analog-to-digital conversion unit as claimed in claim 1, wherein the first threshold voltages are less than the second threshold voltages.

4. An analog-to-digital conversion unit, configured for a pipelined analog-to-digital converter and comprising:

a first sub analog-to-digital converter, coupled to an input voltage, a first threshold voltage and a second threshold voltage, wherein the first sub analog-to-digital converter compares the input voltage with the first threshold voltage and the second threshold voltage, and the first sub analog-to-digital converter outputs a first bit and a second bit according to the comparison result;

a second sub analog-to-digital converter, coupled to the input voltage, a third threshold voltage and a fourth threshold voltage, wherein the second sub analog-to-digital converter compares the input voltage with the third threshold voltage and the fourth threshold voltage, and the second sub analog-to-digital converter outputs a third bit and a fourth bit according to the comparison result;

a third sub analog-to-digital converter, coupled to the input voltage, a fifth threshold voltage and a sixth threshold voltage, wherein the third sub analog-to-digital converter compares the input voltage with the fifth threshold voltage and the sixth threshold voltage, and the third sub analog-to-digital converter outputs a fifth bit and a sixth bit according to the comparison result; and an encoding unit, coupled to the first sub analog-to-digital converter, the second sub analog-to-digital converter and the third sub analog-to-digital converter for encoding the first bit, the second bit, the third bit, the fourth bit, the fifth bit and the sixth bit and outputting a digital data;

wherein the first threshold voltage and the second threshold voltage, the third threshold voltage and the fourth threshold voltage and the fifth threshold voltage and the sixth threshold voltage are respectively two threshold voltages non-successive in terms of levels arrangement of all the threshold voltages.

5. The analog-to-digital conversion unit as claimed in claim 4, wherein the first threshold voltage, the second threshold voltage, the third threshold voltage, the fourth threshold voltage, the fifth threshold voltage and the sixth threshold voltage are sequentially arranged from high level to low level as the sixth threshold voltage, the fourth threshold voltage, the second threshold voltage, the fifth threshold voltage, the third threshold voltage and the first threshold voltage according to the levels of all the threshold voltages.

6. The analog-to-digital conversion unit as claimed in claim 4, wherein the first sub analog-to-digital converter, the second sub analog-to-digital converter and the third sub analog-to-digital converter are respectively a 1.5-bit analog-to-digital conversion unit.

7. The analog-to-digital conversion unit as claimed in claim 4, wherein the length of the digital data is three bits.

8. An analog-to-digital converting method, suitable for a pipelined analog-to-digital converter and comprising:
  receiving a plurality of first threshold voltages, a plurality of second threshold voltages and an input voltage;
  respectively comparing the input voltage with the first threshold voltages and the second threshold voltages and outputting a plurality of first bits and a plurality of second bits according to the comparison results thereof; and
  encoding the first bits and the second bits so as to output a digital data;
  wherein the first threshold voltage and the second threshold voltage respectively corresponding to each of the first bits and each of the second bits during the above-mentioned comparisons are two threshold voltages non-successive in terms of levels arrangement of all the threshold voltages.

9. The analog-to-digital converting method as claimed in claim 8, wherein the first threshold voltages are less than the second threshold voltages.

10. An analog-to-digital converting method, suitable for a pipelined analog-to-digital converter, comprising:
  receiving a first threshold voltage, a second threshold voltage, a third threshold voltage, a fourth threshold voltage, a fifth threshold voltage, a sixth threshold voltage and an input voltage;
  respectively comparing the input voltage with the first threshold voltage, the second threshold voltage, the third threshold voltage, the fourth threshold voltage, the fifth threshold voltage and the sixth threshold voltage;
  outputting a first bit and a second bit according to the comparison results between the input voltage and the first threshold voltage and between the input voltage and the second threshold voltage;
  outputting a third bit and a fourth bit according to the comparison results between the input voltage and the third threshold voltage and between the input voltage and the fourth threshold voltage;
  outputting a fifth bit and a sixth bit according to the comparison results between the input voltage and the fifth threshold voltage and between the input voltage and the sixth threshold voltage; and
  encoding the first bit, the second bit, the third bit, the fourth bit, the fifth bit and the sixth bit so as to output a digital data;
  wherein the first threshold voltage and the second threshold voltage are two non-successive threshold voltages, the third threshold voltage and the fourth threshold voltage are two non-successive threshold voltages and the fifth threshold voltage and the sixth threshold voltage are two non-successive threshold voltages in terms of levels arrangement of all the threshold voltages.

11. The analog-to-digital converting method as claimed in claim 10, wherein the first threshold voltage, the second threshold voltage, the third threshold voltage, the fourth threshold voltage, the fifth threshold voltage and the sixth threshold voltage are sequentially arranged as the sixth threshold voltage, the fourth threshold voltage, the second threshold voltage, the fifth threshold voltage, the third threshold voltage and the first threshold voltage from high level to low level according to the levels of all the threshold voltages.

12. The analog-to-digital converting method as claimed in claim 10, wherein the length of the digital data is three bits.

* * * * *